US006821648B2

(12) United States Patent
Kido et al.

(10) Patent No.: US 6,821,648 B2
(45) Date of Patent: Nov. 23, 2004

(54) ELECTROLUMINESCENT ELEMENT

(75) Inventors: Junji Kido, 4-3, Umamikita 9-chome, Koryo-cho, Kitakatsuragi-gun, Nara (JP), 635-0831; Hitoshi Furusho, Funabashi (JP); Hiroyoshi Fukuro, Funabashi (JP)

(73) Assignees: Junji Kido, Nara (JP); Nissan Chemical Industries, Ltd., Tokyo (JP)

( * ) Notice: Subject to any disclaimer, the term of this patent is extended or adjusted under 35 U.S.C. 154(b) by 6 days.

(21) Appl. No.: 10/148,614

(22) PCT Filed: Dec. 1, 2000

(86) PCT No.: PCT/JP00/08524

§ 371 (c)(1),
(2), (4) Date: May 31, 2002

(87) PCT Pub. No.: WO01/41513

PCT Pub. Date: Jun. 7, 2001

(65) Prior Publication Data

US 2002/0197494 A1 Dec. 26, 2002

(30) Foreign Application Priority Data

Dec. 2, 1999 (JP) .......................................... 11-342742

(51) Int. Cl.$^7$ ............................ B32B 19/00; B32B 9/00; H01B 1/00; C08L 77/06; H01J 1/62; H01J 63/04
(52) U.S. Cl. ....................... 428/690; 428/917; 313/506; 252/40; 252/500; 525/436; 525/540
(58) Field of Search .............................. 428/690, 917; 252/40, 500; 313/506, 504; 525/540, 436

(56) References Cited

U.S. PATENT DOCUMENTS

| 3,172,862 A | | 3/1965 | Gurnee et al. |
| 3,173,050 A | | 3/1965 | Gurnee |
| 3,710,167 A | | 1/1973 | Dresner et al. |
| 4,356,429 A | | 10/1982 | Tang |
| 4,851,487 A | * | 7/1989 | Yaniger et al. ............. 525/540 |
| 4,855,361 A | * | 8/1989 | Yaniger et al. ............. 525/436 |
| 5,227,092 A | * | 7/1993 | Han ........................... 252/500 |
| 5,317,169 A | * | 5/1994 | Nakano et al. ............... 257/40 |
| 5,719,467 A | * | 2/1998 | Antoniadis et al. ......... 313/506 |
| 5,748,271 A | * | 5/1998 | Hikmet et al. ................ 349/69 |
| 5,795,942 A | * | 8/1998 | Rhee et al. .................. 525/540 |
| 5,932,144 A | * | 8/1999 | Shimizu et al. ............. 252/500 |
| 6,001,277 A | * | 12/1999 | Ichimura et al. ......... 252/299.4 |
| 6,403,236 B1 | * | 6/2002 | Ohnishi et al. ............. 428/690 |

FOREIGN PATENT DOCUMENTS

| JP | 06-338392 A | | 12/1994 |
| JP | 07-22696 A | | 8/1995 |
| JP | 9-45479 | | 2/1997 |
| JP | 11-116676 A | | 4/1999 |
| JP | 11-185962 A | | 7/1999 |
| JP | 11-199864 A | | 7/1999 |
| JP | 11-199864 | * | 7/1999 |
| JP | 2000-204158 | * | 7/2000 |
| JP | 2000-243570 | * | 9/2000 |

OTHER PUBLICATIONS

Chihaya Adachi et al., "Electroluminescence in Organic Films With Three–Layer Structure", Japanese Journal of Applied Physics, vol. 27, No. 2, Feb. 1988, pp. L269–L271.
Chihaya Adachi et al., "Organic Electroluminescent Device With A Three–Layer Structure", Japanese Journal of Applied Physics, vol. 27, No. 4, Apr. 1988, pp. L713–L715.
C.W. Tang et al., "Organic Electroluminescent Diodes", American Institute of Physics, vol. 51, No. 12, Sep. 21, 1987, pp. 913–915.
Seiji Hayashi et al., "Electroluminescence of Physics Films With A Conducting Polymer As An Anode", Japanese Journal of Applied Physics, vol. 25, No. 9, Sep. 1986, pp. L773–L775.
R. H. Partridge, "Electroluminescence From Polyvinylcarbazole Films: 3. Electroluminescent Devices", Polymer, vol. 24, Jun. 1983, pp. 748–754.
M. Schadt et al., "Low–Temperature Hole Injection And Hole Trap Distribution in Anthracene", The Journal of Chemical Physics, vol. 50, No. 10, May 15, 1969, pp. 4364–4368.
W. Helfrich et al., "Transients of Volume–Controlled Current and of Recombination Radiation in Anthracene", The Journal of Chemical Physics, vol. 44, No. 8, Apr. 15, 1966, pp. 2902–2909.
W. Helfrich et al., "Recombination Radiation in Anthracene Crystals", Physical Review Letters, vol. 14, No. 7, Feb. 15, 1965, pp. 229–231.
M. Pope et al., "Electroluminescence In Organic Crystals", Letter to the Editor, pp. 2042–2043.
Gekkan Display 10 gatsugo Besssatsu, "Yukki EL Display; Kiso kara Saishin Joho made", Oct. 20, 1998, Kabushiki Kaisha Techno Times sha, pp. 51–57, "Yuki EL Seiko Chunyu Zairyo, Hakkou Zairyou", especially, pp. 54, left column, Par. No. 2.
Applied Physics Letters, vol. 72, No. 17 (1998), pp. 2147–2149, A. Yamamori, et al., "Doped organic light emitting diodes having a 650–nm–thick hole transport layer".
International Search Report.

* cited by examiner

Primary Examiner—B. Hamilton Hess
Assistant Examiner—Camie S Thompson
(74) Attorney, Agent, or Firm—Sughrue Mion, PLLC

(57) ABSTRACT

An electroluminescent device comprising an anode, a cathode, and at least one electroluminescent organic layer interposed therebetween, wherein a luminescent material in the organic layer emits light upon application of a voltage between the anode and the cathode, is characterized in that a salt of an electron accepting dopant with a polyimide precursor and/or polyimide having oligo-aniline units on side chains is formed as an auxiliary carrier transporting layer between the anode and the organic layer, the polyimide precursor and/or polyimide being obtained from a diamine component containing at least 1 mol % of an oligo-aniline unit-bearing diaminobenzene derivative and a tetracarboxylic dianhydride or derivative thereof.

9 Claims, No Drawings

ELECTROLUMINESCENT ELEMENT

This application is the national phase under 35 U.S.C. §371 of PCT International Application No. PCT/JP00/08524 which has an International filing date of Dec. 1, 2000 which designated the United States of America, the entire contents of which are hereby incorporated by reference.

TECHNICAL FIELD

This invention relates to an electroluminescent device comprising at least one electroluminescent organic layer including a light emitting material layer interposed between an anode and a cathode, wherein the light emitting material layer emits light upon application of a voltage between the anode and the cathode.

BACKGROUND ART

The electroluminescent phenomenon of organic material was observed on anthracene single crystals (J. Chem. Phys., 38 (1963), 2042). Thereafter, a relatively intense luminescent phenomenon was observed using a solution electrode having high injection efficiency (Phys. Rev. Lett., 14 (1965), 229). Thereafter, active research works were made on organic luminescent materials between conjugated organic host materials and conjugated organic activators having a fused benzene ring (U.S. Pat. Nos. 3,172,862, 3,173,050, 3,710,167, J. Chem. Phys., 44 (1966), 2902, and J. Chem. Phys., 50 (1969), 4364). The organic luminescent materials listed herein, however, suffer from the drawbacks of increased film thickness and a high electric field needed to induce luminescence.

As one countermeasure, researches were made on thin-film devices using evaporation technique and succeeded in lowering drive voltage. Such devices, however, failed to provide luminance at a practically acceptable level (Polymer, 24 (1983), 748, and Jpn. J. Appl. Phys., 25 (1986), L773).

Recently, Eastman Kodak proposed a device in which a charge transporting layer and a light emitting layer are formed between electrodes by an evaporation technique, accomplishing a high luminance at a low drive voltage (Appl. Phys. Lett., 51 (1987), 913 and U.S. Pat. No. 4,356,429). Thereafter, research works were further activated, as by shifting to three layer type devices in which carrier transporting and light emitting functions are separated. From then onward, the study on organic electroluminescent devices entered the practical stage (Jpn. J. Appl. Phys., 27 (1988), L269, L713).

However, there remains a serious problem of product lifetime as demonstrated by a luminescent life which is 3,000 hours at the shortest and several ten thousands of hours at the longest when operated at several hundreds of candelas.

It was also found that the above-described devices are prone to delamination due to moisture adsorption and thermal degradation and substantially increase dark spots during long-term service. It is believed that such degradation is mainly caused by interfacial separation between the inorganic electrode and the organic layer and the potential barrier between the electrodes and the respective carrier transporting materials although these problems remain outstanding.

DISCLOSURE OF THE INVENTION

Therefore, an object of the invention is to provide an organic electroluminescent device which is restrained from thermal degradation and has improved heat resistance and durability.

Making extensive investigations to attain the above object, the inventors have found that in an electroluminescent device comprising at least one electroluminescent organic layer interposed between the anode and the cathode, especially an electroluminescent device in which an organic hole transporting layer and a light emitting material layer are sequentially deposited on an inorganic electrode (ITO electrode etc.) serving as the anode and the cathode is disposed thereon, improved adhesion and durability are achieved by providing an auxiliary carrier transporting layer between the anode and the organic layer (especially between the inorganic electrode and the organic hole transporting layer), and forming the auxiliary carrier transporting layer from a soluble, electrically conductive compound or polymer in the form of a salt that the polyimide precursor and/or polyimide defined below forms with an electron accepting dopant.

Specifically, the invention provides an electroluminescent device comprising an anode, a cathode, and at least one electroluminescent organic layer interposed therebetween, wherein a luminescent material in the organic layer emits light upon application of a voltage between the anode and the cathode, characterized in that a salt of an electron accepting dopant with a polyimide precursor and/or polyimide having oligo-aniline units on side chains is formed as an auxiliary carrier transporting layer between the anode and the organic layer, the polyimide precursor and/or polyimide being obtained from a diamine component containing at least 1 mol % of an oligo-aniline unit-bearing diaminobenzene derivative represented by the following general formula (1) and a tetracarboxylic dianhydride or derivative thereof.

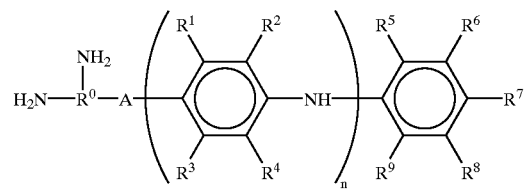

Herein $R^1$ to $R^9$ each are independently hydrogen, an alkyl group, an alkoxy group, a sulfonate group, or a substituted or unsubstituted cyclohexyl, biphenyl, bicyclohexyl or phenylcyclohexyl group, n is a positive number of at least 1, A is a single bond or a divalent organic group selected from the group consisting of —O—, —COO—, —CONH— and —NH—, and $R^0$ is a trivalent organic group containing an aromatic ring.

According to the invention, an aniline oligomer is attached to the polyimide backbone as a side chain, and the aniline oligomer is doped with a halogen, Lewis acid, protonic acid, transition metal compound or electrolyte anion to impart electric conductivity for acquiring an electrode function. This improves the adhesion between the inorganic electrode and a hole transporting layer which is the organic layer while maintaining a hole transporting capability, and precludes interfacial phenomena such as separation for thereby improving the durability of the device itself.

BEST MODE FOR CARRYING OUT THE INVENTION

The electroluminescent device of the invention includes an anode, a cathode and an electroluminescent organic layer sandwiched therebetween.

The anode and cathode used herein may be well-known electrodes. For example, the anode may be an inorganic electrode (or transparent electrode) of ITO or the like formed on a glass substrate. The cathode may be a metallic electrode of aluminum, MgAg alloy or the like.

The electroluminescent organic layer includes a light emitting material layer and may be of well-known construction. A laminate construction in which a hole transporting layer, a light emitting material layer, and a carrier transporting layer are sequentially stacked from the cathode side is typical, though the invention is not limited thereto.

The hole transporting material is not critical although it is generally selected from tertiary aromatic amines such as N,N,N-tris(p-toluyl)amine (TPD), 1,1-bis[(di-4-toluylamine)phenyl]cyclohexane, N,N'-diphenyl-N,N'-bis(3-methylphenyl)(1,1'-biphenyl)-4,4'-diamine, N,N,N',N'-tetrakis(4-methylphenyl)(1,1'-biphenyl)-4,4'-diamine, N,N'-bis(1-naphthyl)-N,N'-diphenyl-1,1'-bisphenyl-4,4'-diamine, and 4,4',4"-tris(3-methylphenylamino)triphenyl-amine. Pyrazoline derivatives are also useful.

The carrier transporting material is not critical although generally aromatic fused ring compounds and metal complex compounds are often used. Examples include metal complex compounds such as tris(8-hydroxyquinoline) aluminum (Alq3) and bis(10-hydroxybenzo[h]quinolate) beryllium (BeBq2), 1,3,4-oxathiazole derivatives, 1,2,4-triazole derivatives, bis(benzimidazole) derivatives of perylene dicarboxyimide, and thiopyrane sulfone derivatives.

Examples of the light emitting material include metal complex compounds such as Alq3 and tris(5-cyano-8-hydroxyquinoline)aluminum (Al(Q-CN)), and dyes such as oxathiazoles, e.g., biphenyl-p-(t-butyl)phenyl-1,3,4-oxathiazole, triazoles, allylenes, and coumarins though is not limited thereto.

In the electroluminescent device of the invention, an auxiliary carrier transporting layer is interposed between the anode and the organic layer, and when the organic layer includes a plurality of layers, between the anode and a layer disposed most closely thereto, typically a hole transporting layer, for assisting in charge transportation.

The auxiliary carrier transporting layer is a thin film of a salt of an electron accepting dopant with a polyimide precursor and/or polyimide having oligo-aniline units on side chains, the polyimide precursor and/or polyimide being obtained from a diamine component containing at least 1 mol % of an oligo-aniline unit-bearing diaminobenzene derivative represented by the following general formula (1) and a tetracarboxylic dianhydride or derivative thereof.

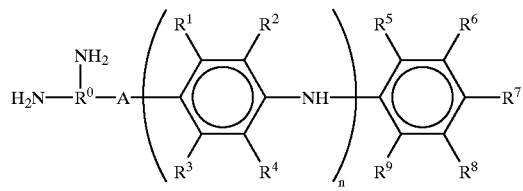

(1)

In formula (1), $R^1$ to $R^9$ each are independently hydrogen, an alkyl group, an alkoxy group, a sulfonate group, or a substituted or unsubstituted cyclohexyl, biphenyl, bicyclohexyl or phenylcyclohexyl group, n is a positive number of at least 1, "A" is a single bond or a divalent organic group selected from among —O—, —COO—, —CONH— and —NH—, and $R^0$ is a trivalent organic group containing an aromatic ring.

$R^1$ to $R^9$ are most often hydrogen, although alkyl, alkoxy, cyclohexyl, biphenyl, bicyclohexyl, phenylcyclohexyl and sulfonate groups are preferred for increasing solvent solubility. More preferably, $R^1$ to $R^9$ are hydrogen, alkyl groups having 1 to 20 carbon atoms or alkoxy groups having 1 to 20 carbon atoms. It is noted that $R^1$ to $R^9$ may be the same or different.

Examples of suitable alkyl groups include methyl, ethyl, propyl, isopropyl, butyl, t-butyl, hexyl, octyl, decyl, and dodecyl. Alkyl groups having 1 to 4 carbon atoms are especially preferred.

Examples of suitable alkoxy groups include methoxy, ethoxy, propoxy, isopropoxy, butoxy, isobutoxy, s-butoxy, t-butoxy, hexyloxy, octyloxy, decyloxy and dodecyloxy. Alkoxy groups having 1 to 4 carbon atoms are especially preferred.

Illustratively, $R^0$ is a trivalent organic group containing an aromatic ring such as a phenyl, biphenyl or naphthyl group as represented below.

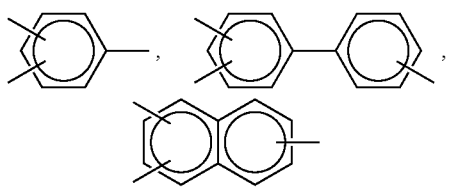

The diaminobenzene derivative used in the polyimide precursor and/or polyimide according to the invention is composed of the diamine moiety, the oligo-aniline moiety and the linkage A joining them together as described above. Although the synthesis method is not critical, the diaminobenzene derivative can be synthesized, for example, by the method described below.

For the synthesis of diamines, a general procedure is by first synthesizing a corresponding dinitro compound of the following general formula (2) and then reducing the nitro group in a customary manner for conversion to an amino group.

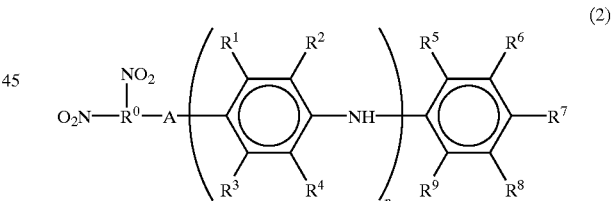

(2)

Herein, $R^1$ to $R^9$, $R^0$, n and A are as defined above.

The method generally employed for the synthesis of the compound of formula (2) involves the steps of joining a dinitro moiety of the following formula to an oligo-aniline moiety through the linkage A and thereafter, bonding substituents $R^1$ to $R^9$, or the steps of previously synthesizing an oligo-aniline having substituents, and thereafter, joining a dinitro moiety thereto through the linkage A.

dinitro moiety:

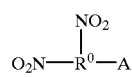

The linkage "A" is a single bond, ether bond —O—, ester bond —COO—, amide bond —CONH— or secondary amine bond —NH—. These linking groups can be formed by conventional organic synthesis techniques.

For example, the ether bond is generally formed by reacting a corresponding halide derivative with a hydroxyl-substituted derivative in the presence of an alkali. The ester bond is generally formed by reacting a corresponding acid chloride with a hydroxyl-substituted derivative in the presence of an alkali. The amide bond is generally formed by reacting a corresponding acid chloride with an amino-substituted derivative in the presence of an alkali. The secondary amine bond is generally formed by effecting dehydration condensation reaction of a corresponding primary amine group with a hydroxyl-substituted derivative.

Examples of the reactant from which the dinitro moiety is formed include dinitrobenzene, dinitronaphthalene and dinitrobiphenyl which have been substituted with a substituent to form the linkage A, for example, a halogen atom, hydroxyl, haloacyl or amino group. The preferred reactant is a dinitrobenzene having the substituent. Examples of the substituted dinitrobenzene include 2,3-dinitrobenzene, 2,4-dinitrobenzene, 2,5-dinitrobenzene, 2,6-dinitrobenzene, 3,4-dinitrobenzene and 3,5-dinitrobenzene. However, from the standpoints of availability of the reactant and reactivity during polyimide polymerization, 2,4-dinitrochlorobenzene, 2,4-dinitrophenol, 2,4-dinitrobenzoic chloride and 2,4-dinitroaniline are most commonly used.

On the other hand, the oligo-aniline is obtained by effecting dechlorination ammonium reaction of an aromatic amine hydrochloride having the above substituent with an aromatic amine. In the oligo-aniline moiety, n has a value of 1 or more, and desirably n has a value of 2 or more for electrical conductivity, and also a value of 20 or less for solvent solubility. More desirably, n has a value of 8 or less.

The diaminobenzene derivative of general formula (1) obtained by the method described above is then subjected to polycondensation with a tetracarboxylic acid or derivative thereof, such as tetracarboxylic acid, tetracarboxylic dihalide and tetracarboxylic dianhydride, whereby a polyimide having oligo-aniline units on side chains is synthesized.

In the practice of the invention, the tetracarboxylic acids and derivatives thereof are not critical. Preferred are alicyclic tetracarboxylic acids, especially 1,2,3,4-cyclobutanetetracarboxylic dianhydride, heterocyclic tetracarboxylic acids, aromatic ring tetracarboxylic acids, fused ring tetracarboxylic acids, and derivatives thereof.

Examples of such acids include aromatic tetracarboxylic acids and dianhydrides and dicarboxylic acid diacid halides thereof, such as, for example, pyromellitic acid, 2,3,6,7-naphthalenetetracarboxylic acid, 1,2,5,6-naphthalenetetracarboxylic acid, 1,4,5,8-naphthalenetetracarboxylic acid, 3,3',4,4'-biphenyltetracarboxylic acid, 2,3,3',4-biphenyltetracarboxylic acid, bis(3,4-dicarboxyphenyl) ether, 3,3',4,4'-benzophenonetetracarboxylic acid, bis(3,4-dicarboxyphenyl)-sulfone, bis(3,4-dicarboxyphenyl) methane, 2,2-bis(3,4-dicarboxyphenyl)propane, 1,1,1,3,3,3-hexafluoro-2,2-bis(3,4-dicarboxyphenyl)propane, bis(3,4-dicarboxyphenyl)diphenyl-silane, 2,3,4,5-pyridine tetracarboxylic acid, and 2,6-bis(3,4-dicarboxyphenyl) pyridine;

alicyclic tetracarboxylic acids and dianhydrides and dicarboxylic acid diacid halides thereof, such as, for example, 1,2,3,4-cyclobutanetetracarboxylic acid, 1,2,3,4-cyclopentanetetracarboxylic acid, 2,3,5-tricarboxycyclopentyl acetic acid, and 3,4-dicarboxy-1,2,3,4-tetrahydro-1-naphthalene succinic acid; and aliphatic tetracarboxylic acids and dianhydrides and dicarboxylic acid diacid halides thereof, such as, for example, 1,2,3,4-butanetetracarboxylic acid.

These tetracarboxylic acids and derivatives may be used alone or in admixture of two or more.

According to the invention, by copolymerizing the tetracarboxylic acid or derivative thereof with the diaminobenzene derivative of general formula (1), abbreviated hereinafter as diamine (1), and optionally, another ordinary diamine, abbreviated hereinafter as ordinary diamine, there is obtained a polyimide having a molecular chain having an electrically conductive side chain, which is used as a coating. The diamine used to produce the polyimide essentially includes diamine (1).

The ordinary diamine other than diamine (1) is selected from primary diamines commonly used in the synthesis of polyimides and not critical. Examples of the ordinary diamine include aromatic diamines such as p-phenylenediamine, m-phenylenediamine, 2,5-diaminotoluene, 2,6-diaminotoluene, 4,4'-diaminobiphenyl, 3,3'-dimethyl-4,4'-diaminobiphenyl, diaminodiphenylmethane, diaminodiphenyl ether, 2,2'-diaminodiphenylpropane, bis(3,5-diethyl-4-aminophenyl) methane, diaminodiphenyl-sulfone, diaminobenzophenone, diaminonaphthalene, 1,4-bis(4-aminophenoxy)benzene, 1,4-bis(4-aminophenyl)benzene, 9,10-bis(4-aminophenyl) anthracene, 1,3-bis(4-aminophenoxy)-benzene, 4,4'-bis(4-aminophenoxy)diphenylsulfone, 2,2-bis[4-(4-aminophenoxy)phenyl]propane, 2,2-bis(4-aminophenyl) hexafluoropropane, and 2,2-bis[4-(4-aminophenoxy)phenyl] hexafluoropropane; alicyclic diamines such as bis(4-aminocyclohexyl)methane and bis(4-amino-3-methylcyclohexyl)methane; aliphatic diamines such as tetramethylenediamine and hexamethylenediamine; and diaminosiloxanes of the formula shown below. These diamines may be used alone or in admixture of two or more. It is noted that the polyimide can be improved in surface properties such as water repellency by adjusting the ratio of the moles of diamine (1) to the total moles of diamines used during polyimide polymerization.

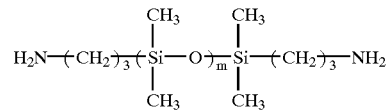

Herein, m is an integer of 1 to 10.

Once a polyimide precursor is obtained by reacting the tetracarboxylic acid or derivative thereof with the diamine (1) and optionally, the ordinary diamine for polymerization, the polyimide precursor is then subjected to ring-closing imidization. The tetracarboxylic acid or derivative thereof used herein is typically a tetracarboxylic dianhydride. The ratio of the moles of the tetracarboxylic dianhydride to the total moles of the diamine (1) and the ordinary diamine combined is preferably from 0.8 to 1.2. Like conventional polycondensation reaction, a polymer having a higher degree of polymerization is obtained as this molar ratio becomes closer to 1.

Too low a degree of polymerization may result in a polyimide film having insufficient strength on use, whereas too high a degree of polymerization may worsen the efficiency of operation during polyimide film formation.

Therefore, the product of the above reaction should preferably have such a degree of polymerization that a polyimide precursor solution (having a concentration of 0.5 g/dl in N-methylpyrrolidone at a temperature of 30° C.) may have a reduced viscosity of 0.05 to 5.00 dl/g.

In reacting the tetracarboxylic dianhydride with the primary diamine for polymerization, any desired method may be employed. One commonly used method is by dissolving the primary diamine in a polar organic solvent such as N-methylpyrrolidone, N,N-dimethylacetamide or N,N-dimethylformamide, adding the tetracarboxylic dianhydride to the solution, and reacting them to synthesize a polyimide precursor, followed by dehydration ring-closure reaction for imidization.

When the tetracarboxylic dianhydride is reacted with the primary diamine to form the polyimide precursor, the reaction temperature may be any temperature selected in the range of −20° C. to 150° C., preferably −5° C. to 100° C.

The polyimide precursor can be converted to a polyimide by heating the polyimide precursor at 100° C. to 400° C. for dehydration or subjecting the polyimide precursor to chemical imidization in the presence of a commonly used imidization catalyst such as triethylamine/acetic anhydride.

When the polyimide according to the invention is prepared, the diaminobenzene derivative of formula (1), simply diamine (1), is used in an amount of at least 1 mol %, and preferably at least 5 mol % of the entire diamines.

In forming a coating of the polyimide, most often the polyimide precursor solution is directly applied to a substrate and heated on the substrate for imidization to form a polyimide coating. The polyimide precursor solution used herein may be the polymerization solution as such or a solution obtained by pouring the polyimide precursor formed into a large volume of a poor solvent such as water or methanol, recovering the precipitate, and dissolving it again in a solvent.

The diluent solvent for the polyimide precursor and/or the solvent for dissolving again the precipitated and recovered polyimide precursor may be any solvent as long as the polyimide precursor is dissolvable therein.

Examples of the solvent include N-methylpyrrolidone, N,N-dimethylacetamide and N,N-dimethylformamide. These solvents may be used alone or in admixture. Even a solvent which by itself cannot form a uniform medium may be added to the above solvent insofar as a uniform medium is obtainable. Examples of such solvents include ethyl cellosolve, butyl cellosolve, ethyl Carbitol, butyl Carbitol, ethyl Carbitol acetate, and ethylene glycol.

In forming a polyimide coating on a substrate, it is, of course, preferred to add an additive such as a coupling agent to the polyimide solution for the purpose of further enhancing the adhesion between the polyimide coating and the substrate.

The temperature used for heat imidization may be any temperature in the range of 100 to 400° C., with a range of 150 to 350° C. being especially preferred.

On the other hand, if the polyimide according to the invention is soluble in a solvent, the polyimide precursor resulting from reaction of the tetracarboxylic dianhydride with the primary diamine may be imidized in the solution to form a polyimide solution. When the polyimide precursor in the solution is converted into a polyimide, a method of inducing dehydration ring-closure by heating is generally employed. The temperature of ring-closure by heat dehydration is any temperature selected in the range of 150 to 350° C., and preferably 120 to 250° C.

Another method of converting the polyimide precursor to the polyimide is chemical ring-closure using well-known dehydration ring-closure catalysts. The polyimide solution thus obtained may be used without further treatment or after it is precipitated in a poor solvent such as methanol or ethanol, isolated and dissolved again in a suitable solvent.

The solvent used for dissolving the polyimide again is not critical as long as the polyimide is dissolvable therein. Exemplary solvents include 2-pyrrolidone, N-methylpyrrolidone, N-ethylpyrrolidone, N-vinylpyrrolidone, N,N-dimethylacetamide, N,N-dimethylformamide, and γ-butyrolactone. Besides, a solvent which by itself cannot dissolve the polyimide may be added to the foregoing solvent insofar as the desired solubility is not impaired. Examples of such solvents include ethyl cellosolve, butyl cellosolve, ethyl Carbitol, butyl Carbitol, ethyl Carbitol acetate, and ethylene glycol.

In forming a polyimide coating on a substrate, it is, of course, preferred to add an additive such as a coupling agent to the polyimide solution for the purpose of further enhancing the adhesion between the polyimide coating and the substrate.

By applying the solution onto a substrate and evaporating the solvent, a polyimide coating can be formed on the substrate. Any temperature may be used at this stage as long as the solvent evaporates. Usually a temperature of 80 to 150° C. is sufficient.

The coating method of forming a thin film of the polyimide according to the invention includes dipping, spin coating, transfer printing, roll coating and brush coating, but is not limited thereto. The coating thickness is not critical although a coating as thin as possible is desirable for improving external emission efficiency. Usually, a thickness of 100 to 1,000 Å is preferred.

According to the invention, the polyimide precursor and/or polyimide having oligo-aniline units on side chains as described above forms a salt with an electron accepting dopant, which salt is interposed as an auxiliary carrier transporting layer between the anode and the organic layer.

With respect to the salt formation or doping of the polyimide precursor and/or polyimide having oligo-aniline units on side chains with an electron accepting dopant, the electron accepting dopant is selected from among Lewis acids, protonic acids, transition metal compounds, electrolyte salts, halides and the like. Doping with these dopants enables to form polyimide thin films with a lower resistance.

Lewis acids include $FeCl_3$, $PF_5$, $AsF_5$, $SbF_5$, $BF_5$, $BCl_3$, and $BBr_3$.

Protonic acids include inorganic acids such as HF, HCl, $HNO_5$, $H_2SO_4$ and $HClO_4$, and organic acids such as benzene sulfonic acid, p-toluenesulfonic acid, dodecylbenzenesulfonic acid, polyvinylsulfonic acid, methanesulfonic acid, 1-butanesulfonic acid, vinylphenylsulfonic acid and camphorsulfonic acid.

Transition metal compounds include FeOCl, $TiCl_4$, $ZrCl_4$, $HfCl_4$, $NbF_5$, $NbCl_5$, $TaCl_5$ and $MoF_5$.

Electrolyte salts include $LiSbF_6$, $LiAsF_6$, $NaAsF_6$, $NaSbF_6$, $KAsF_6$, $KSbF_6$, $[(n-Bu)_4N]AsF_6$, $[(n-Bu)_4N]SbF_6$, $[(n-Et)_4N]AsF_6$ and $[(n-Et)_4N]SbF_6$.

Halides includes $Cl_2$, $Br_2$, $I_2$, ICl, $ICl_3$, IBr and IF.

Of these electron accepting dopants, ferric chloride is the preferred Lewis acid, hydrochloric acid is the preferred protonic acid, perchloric acid is the preferred inorganic acid, and p-toluenesulfonic acid and camphorsulfonic acid are the preferred organic acids.

Any desired method may be used in doping the polyimide precursor or polyimide with the above dopants. Doping may be carried out in a solution of the polyimide precursor or polyimide in an organic solvent or after a thin film is formed therefrom.

When doping is carried out in a solution of the polyimide precursor or polyimide in an organic solvent, ferrous chloride among the transition metal compounds and p-toluenesulfonic acid and other organic acids are desirably used as the dopant. The doping concentration differs depending on the molecular weight of the aniline oligomer. In general, the dopant is preferably added such that one or less dopant molecule is available per nitrogen atom in the aniline oligomer. Alternatively, after a coating is formed, it can be doped by exposing it to hydrochloric acid vapor or iodine vapor.

In forming the auxiliary carrier transporting layer according to the invention, when the polyimide precursor and/or polyimide is doped in its organic solvent solution, this solution is used to form a thin film by a well-known method on the inorganic electrode (transparent electrode) of ITO etc. which has been formed on the glass substrate and serves as the anode. The inorganic electrode used herein has been removed of foreign matter such as organic matter on the surface by cleaning treatment such as back sputtering, ozone treatment or acid pickling.

After the auxiliary carrier transporting layer is formed on the electrode-bearing substrate in this way, organic layers for electroluminescence are deposited. The layer structure largely varies and is not critical. Most often, a device in which a hole transporting layer, a light emitting layer and a carrier transporting layer are sequentially deposited by evaporation is used.

As the hole transporting material, carrier transporting material and light emitting material, the aforementioned compounds are used. These materials are sequentially deposited by vacuum evaporation and on the top of them, a MgAg alloy is evaporated as a cathode. This results in an electroluminescent device which emits light of a specific wavelength upon application of a voltage thereacross.

Examples are given below for illustrating the present invention although the invention is not limited to the examples.

EXAMPLE 1

A polyimide precursor solution was prepared, as shown by the scheme below, by dissolving 3 g (0.00786 mol) of [4-{(4-(2,4-diaminophenoxy)phenyl)amino}phenyl]phenylamine in 25.22 g of N-methylpyrrolidone, adding 1.45 g (0.00741 mol) of 4,9-dioxatricyclo[5.3.0.0$^{2,6}$]decane thereto, and effecting polycondensation reaction for 24 hours at room temperature.

The polyimide precursor thus obtained had a reduced viscosity of 0.52 dl/g (0.5 wt %, 25° C.). This solution was coated onto a glass substrate and heat treated at 250° C. for one hour, forming a uniform polyimide film. IR analysis confirmed that the coating was a polyimide containing aniline oligomers.

After the polyimide varnish obtained above was doped with camphorsulfonic acid as the dopant, it was applied onto an ITO electrode to a thickness of 100 Å. Thereafter, TPD of 400 Å thick, Alq of 600 Å thick, and MgAg were successively deposited thereon by an evaporation technique.

The thus fabricated device was measured for threshold voltage for emission, maximum luminance, luminous efficiency and current efficiency. For a similar sample using 5-sulfosalicylic acid as the dopant, the same properties were measured. The results are shown in Table 1.

TABLE 1

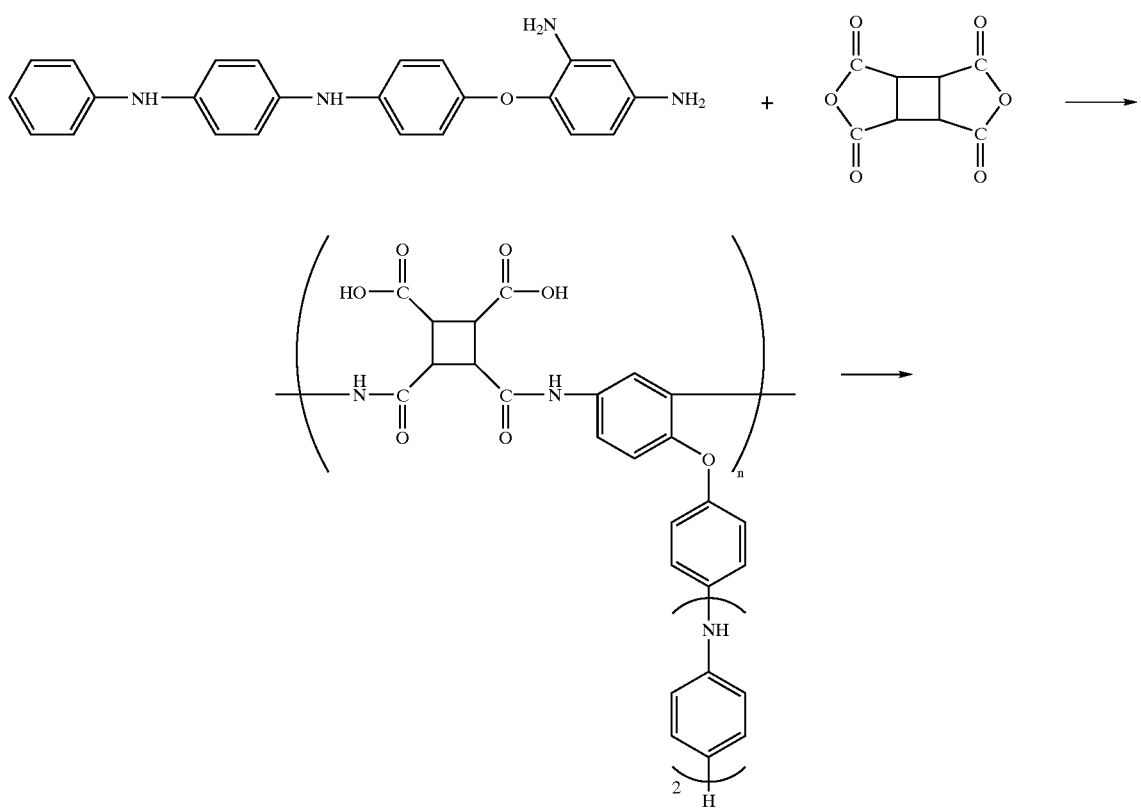

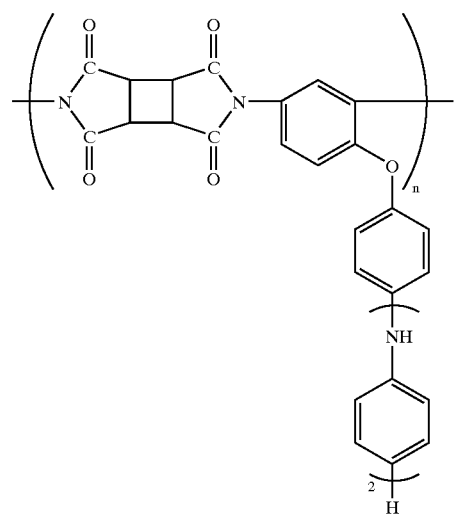

| Electroluminescent device's properties | | |
|---|---|---|
| Dopant | camphorsulfonic acid | 5-sulfosalicylic acid |
| Threshold voltage for emission (V) | 9 | 9 |
| Maximum luminance (cd/m$^2$) | 3200 (25 V) | 1300 (20 V) |
| Luminous efficiency (lm/W) | 0.81 (17 V) | 0.49 (24 V) |
| Current efficiency (cd/A) | 4.73 (20 V) | 3.54 (24 V) |

EXAMPLE 2

A polyimide precursor solution was prepared, as shown by the scheme below, by dissolving 3 g (0.00640 mol) of [4-{(4-(2,4-diaminophenoxy)phenyl)amino}phenyl](4-phenyl-amino)phenylamine in 25.22 g of N-methylpyrrolidone, adding 1.45 g (0.00741 mol) of 4,9-dioxatricyclo[5.3.0.0$^{2,6}$]decane thereto, and effecting polycondensation reaction for 24 hours at room temperature.

The polyimide precursor thus obtained had a reduced viscosity of 0.55 dl/g (0.5 wt %, 25° C.). This solution was coated onto a glass substrate and heat treated at 250° C. for one hour, forming a uniform polyimide film. IR analysis confirmed that the coating was a polyimide containing aniline oligomers.

After the polyimide varnish obtained above was doped with camphorsulfonic acid as the dopant, it was applied onto an ITO electrode to a thickness of 100 Å. Thereafter, TPD of 400 Å thick, Alq of 600 Å thick, and MgAg were successively deposited thereon by an evaporation technique.

The thus fabricated device was measured for threshold voltage for emission, maximum luminance, luminous efficiency and current efficiency. For a similar sample using 5-sulfosalicylic acid as the dopant, the same properties were measured. The results are shown in Table 2.

TABLE 2

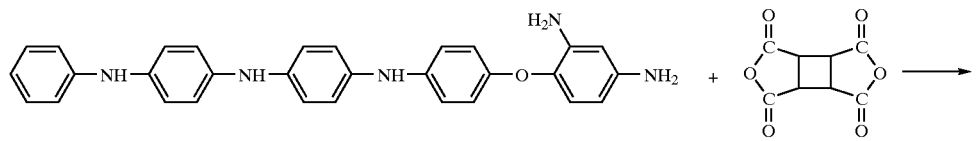

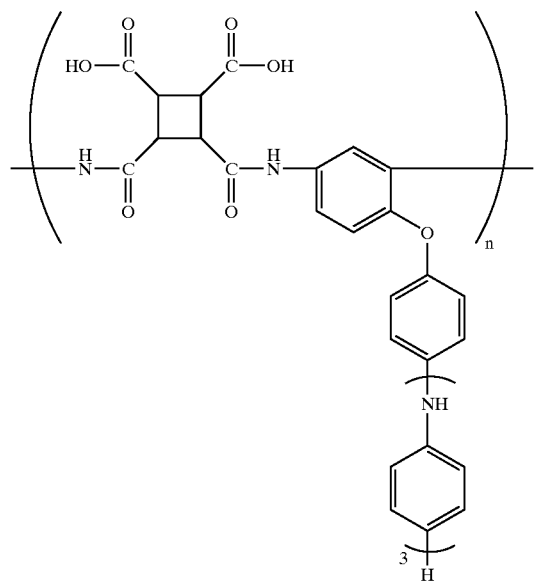

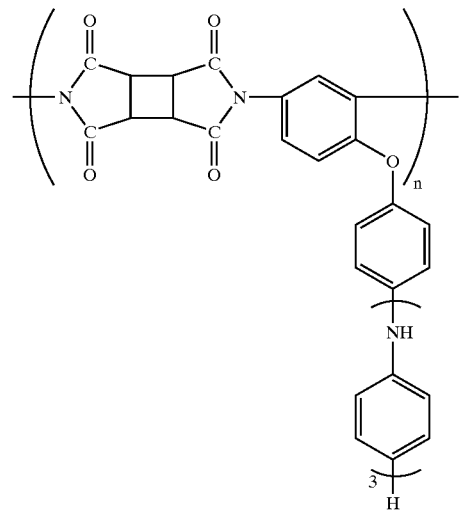

Electroluminescent device's properties

| Dopant | camphorsulfonic acid | 5-sulfosalicylic acid |
| --- | --- | --- |
| Threshold voltage for emission (V) | 6 | 6 |
| Maximum luminance (cd/m$^2$) | 2900 (21 V) | 3700 (20 V) |
| Luminous efficiency (lm/W) | 0.91 (13 V) | 0.93 (15 V) |
| Current efficiency (cd/A) | 4.21 (16 V) | 4.85 (17 V) |

The diaminobenzene derivatives used herein are easy to synthesize and are used as one of reactants to produce polyimides having improved heat resistance, film strength and coating properties as well as antistatic and low charge accumulation properties. Using the polyimides as the auxiliary carrier transporting layer, electroluminescent devices having enhanced reliability are obtainable.

What is claimed is:

1. An electroluminescent device comprising
   an anode
   a cathode;
   at least one electroluminescent organic layer interposed therebetween; and
   an auxiliary carrier transporting layer between the anode and organic layer,
   wherein said at least one electroluminescent organic layer comprises a luminescent material that emits light upon application of a voltage between the anode and the cathode;
   said auxiliary carrier transporting layer is formed from a salt of an electron-accepting dopant and a polyimide precursor and/or polyimide having oligo-aniline units on side chains, and
   the polyimide precursor and/or polyimide being obtained from a diamine component containing at least 1 mol % of an oligo-aniline unit-bearing diaminobenzene derivative represented by the following general formula (1) and a tetracarboxylic dianhydride or derivative thereof,

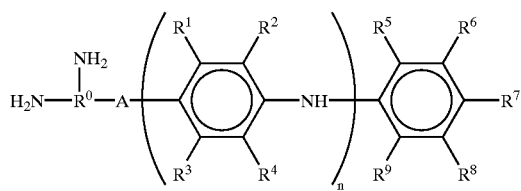

wherein $R^1$ to $R^9$ are independently selected from the group consisting of hydrogen, an alkyl group, an alkoxy group, a sulfonate group, and a substituted or unsubstituted cyclohexyl, biphenyl, bicyclohexyl or phenylcyclohexyl group, n is a positive number of at least 1, A is a single bond or a divalent organic group selected from the group consisting of —O—, —COO—, —CONH— and —NH—, and $R^0$ is a trivalent organic group containing an aromatic ring.

2. The electroluminescent device of claim 1 wherein in formula (1), $R^1$ to $R^9$ each are independently hydrogen, an alkyl group having 1 to 20 carbon atoms or an alkoxy group having 1 to 20 carbon atoms, and n is an integer of 1 to 20.

3. The electroluminescent device of claim 1 wherein the polyimide contains at least 5 mol % of units based on the diaminobenzene derivative of formula (1).

4. The electroluminescent device of claim 1 wherein the tetracarboxylic dianhydride or derivative thereof is an alicyclic tetracarboxylic dianhydride or derivative thereof.

5. The electroluminescent device of claim 4 wherein the alicyclic tetracarboxylic dianhydride or derivative thereof is 1,2,3,4-cyclobutanetetracarboxylic dianhydride.

6. The electroluminescent device of claim 1 wherein the tetracarboxylic dianhydride or derivative thereof is a heterocyclic tetracarboxylic dianhydride or derivative thereof.

7. The electroluminescent device of claim 1 wherein the tetracarboxylic dianhydride or derivative thereof is an aromatic ring tetracarboxylic dianhydride or derivative thereof.

8. The electroluminescent device of claim 1 wherein the tetracarboxylic dianhydride or derivative thereof is a fused ring tetracarboxylic dianhydride or derivative thereof.

9. The electroluminescent device of claim 1 wherein the dopant is selected from the group consisting of a Lewis acid, protonic acid, transition metal compound, electrolyte salt and halide.

* * * * *